(12) United States Patent
Kim et al.

(10) Patent No.: US 8,377,626 B2
(45) Date of Patent: Feb. 19, 2013

(54) METHODS OF FORMING A PATTERN USING NEGATIVE-TYPE PHOTORESIST COMPOSITIONS

(75) Inventors: Kyoung-Mi Kim, Anyang-si (KR); Jin-Baek Kim, Seoul (KR); Ji-Young Park, Daejeon (KR); Young-Ho Kim, Yongin-si (KR)

(73) Assignees: Samsung Electronics Co., Ltd., Suwon-si, Gyeonggi-do (KR); Korea Advanced Institute of Science and Technology, Yuseong-gu, Daejeon (KR)

( * ) Notice: Subject to any disclaimer, the term of this patent is extended or adjusted under 35 U.S.C. 154(b) by 303 days.

(21) Appl. No.: 12/662,076

(22) Filed: Mar. 30, 2010

(65) Prior Publication Data

US 2010/0248134 A1 Sep. 30, 2010

(30) Foreign Application Priority Data

Mar. 31, 2009 (KR) .................. 10-2009-0027541

(51) Int. Cl.
*G03F 7/00* (2006.01)
*G03F 7/004* (2006.01)
*G03F 7/40* (2006.01)

(52) U.S. Cl. ............ 430/270.1; 430/311; 430/317; 430/322; 430/330; 430/331; 430/913; 430/945

(58) Field of Classification Search .............. 430/270.1, 430/317, 913, 331, 330, 311, 945
See application file for complete search history.

(56) References Cited

U.S. PATENT DOCUMENTS

| | | | |
|---|---|---|---|
| 6,670,093 B2 * | 12/2003 | Song et al. | 430/270.1 |
| 6,686,132 B2 | 2/2004 | Cheng et al. | |
| 7,611,820 B2 * | 11/2009 | Kanda et al. | 430/270.1 |
| 7,790,351 B2 * | 9/2010 | Fukuhara et al. | 430/270.1 |
| 7,932,161 B2 * | 4/2011 | Apanius et al. | 438/455 |
| 2009/0239176 A1 * | 9/2009 | Kanda | 430/285.1 |

FOREIGN PATENT DOCUMENTS

| | | |
|---|---|---|
| JP | 2001-022076 A | 1/2001 |
| JP | 2008-116488 A | 5/2008 |
| KR | 10-0521809 B1 | 10/2005 |
| WO | WO 2009084775 A1 * | 7/2009 |

* cited by examiner

*Primary Examiner* — Amanda C. Walke
(74) *Attorney, Agent, or Firm* — Lee & Morse, P.C.

(57) ABSTRACT

A method of forming a pattern and a negative-type photoresist composition, the method including forming a photoresist film on a substrate by coating a photoresist composition thereon, the photoresist composition including a polymer, a photoacid generator, and a solvent, wherein the polymer includes an alkoxysilyl group as a side chain and is cross-linkable by an acid to be insoluble in a developer; curing a first portion of the photoresist film by exposing the first portion to light, the exposed first portion being cured by a cross-linking reaction of the alkoxysilyl groups therein; and providing a developer to the photoresist film to remove a second portion of the photoresist film that is not exposed to light, thereby forming a photoresist pattern on the substrate.

16 Claims, 10 Drawing Sheets

1ST DIRECTION
⊗——— 2ND DIRECTION

1ST DIRECTION
⊗ ⟶ 2ND DIRECTION

1ST DIRECTION
⊗ ⟶ 2ND DIRECTION

METHODS OF FORMING A PATTERN USING NEGATIVE-TYPE PHOTORESIST COMPOSITIONS

BACKGROUND

1. Field

Embodiments relate to negative-type photoresist compositions and methods of forming a pattern using the same.

2. Description of the Related Art

Organic photosensitive materials, e.g., photoresist compositions, are materials that may be physically and/or chemically changed by light and/or radiation energy. The organic photosensitive materials may be applied to microfabrication technologies, e.g., a photolithography process, and have been used for manufacturing electronic devices, e.g., integrated circuit (IC) devices, memory devices, printed circuit boards (PCBs), microelectromechanical systems (MEMS), display devices, image display devices, etc.

A chemically amplified photoresist, which may be an organic photosensitive material, may include an acid-reactive polymer or an acid-reactive compound together with a photoacid generator. In a chemical amplification, active species generated by one photon may cause a chain reaction so that quantum yield may increase greatly. In the chemically amplified photoresist, an acid may be generated from the photoacid generator when exposed to light; and combination or decomposition of the acid-reactive polymer or the acid-reactive compound may occur by chemical action, i.e., catalyzation, of the acid.

In the chemically amplified photoresist, the acid-reactive polymer or the acid-reactive compound may not directly react by exposure to light. Rather, acid may be generated from a portion of the photoacid generator exposed to light, thereby forming a latent image. The generated acid may serve as a catalyst for the acid-reactive materials in a subsequent post-exposure bake (PEB) process. Thus, a chemical reaction may be amplified in the chemically amplified photoresist to cause a solubility difference between an exposed portion and a non-exposed portion thereof. The PEB process has been widely used for forming an image pattern using the chemically amplified photoresist.

SUMMARY

Embodiments are directed to negative-type photoresist compositions and methods of forming a pattern using the same, which substantially overcome one or more of the problems due to the limitations and disadvantages of the related art.

It is a feature of an embodiment to provide negative-type photoresist compositions having high sensitivity, wherein the negative-type photoresist compositions may be cured without performing a post-exposure bake (PEB) process.

At least one of the above and other features and advantages may be realized by providing a method of forming a pattern, the method including forming a photoresist film on a substrate by coating a photoresist composition thereon, the photoresist composition including a polymer, a photoacid generator, and a solvent, wherein the polymer includes an alkoxysilyl group as a side chain and is cross-linkable by an acid to be insoluble in a developer; curing a first portion of the photoresist film by exposing the first portion to light, the exposed first portion being cured by a cross-linking reaction of the alkoxysilyl groups therein; and providing a developer to the photoresist film to remove a second portion of the photoresist film that is not exposed to light, thereby forming a photoresist pattern on the substrate.

Curing the first portion of the photoresist film may include curing the first portion of the photoresist film at a low temperature at which an acid generated at the first portion is prevented from diffusing to the second portion.

Curing the polymer of the first portion of the photoresist film may be performed at a temperature of less than about 60° C.

The polymer may include a repeating unit represented by Chemical Formula 1:

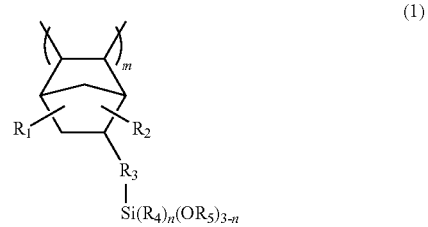

(1)

wherein, in Chemical Formula 1, $R_1$ and $R_2$ may each independently be hydrogen, a $C_1$-$C_4$ alkyl group, a $C_1$-$C_4$ alkoxy, or phenyl group, $R_3$ may be a divalent functional group including at least one of a $C_1$ to $C_6$ alkylene chain, arylene, alkyleneoxy, arlyleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, and a $C_6$-$C_{30}$ unsaturated aliphatic divalent group, each $R_4$ may independently be a $C_1$-$C_{10}$ alkyl group, an aryl group, or a $C_2$-$C_6$ alkenyl group, and each $R_5$ may independently be a $C_1$-$C_4$ alkyl group, and $2 \leq m \leq 10{,}000$, $0 \leq n \leq 2$, m and n are integers, when n is 0 or 1, groups represented by $OR_5$ may be substantially the same as or different from each other, and when n is 2, groups represented by $R_4$ may be substantially the same as or different from each other.

The polymer may include a repeating unit represented by Chemical Formula 2:

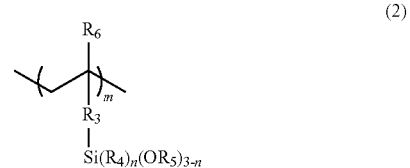

(2)

wherein, in Chemical Formula 2, $R_6$ may be hydrogen, a $C_1$-$C_4$ alkyl group, a $C_1$-$C_4$ alkoxy group, or a phenyl group, $R_3$ may be a divalent functional group including at least one of a $C_1$-$C_6$ alkylene chain, arylene, alkyleneoxy, arlyleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, and a $C_6$-$C_{30}$ unsaturated aliphatic divalent group, each $R_4$ may independently be a $C_1$-$C_{10}$ alkyl group, an aryl group, or a $C_2$-$C_6$ alkenyl group, and each $R_5$ may independently be a $C_1$-$C_4$ alkyl group, and $2 \leq m \leq 10{,}000$, $0 \leq n \leq 2$, m and n are integers, when n is 0 or 1, groups represented by $OR_5$ may be substantially the same as or different from each other, and when n is 2, groups represented by $R_4$ may be substantially the same as or different from each other.

The polymer may include a repeating unit represented by Chemical Formula 3:

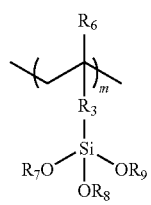

(3)

wherein, in Chemical Formula 3, $R_6$ may be hydrogen or a $C_1$-$C_4$ alkyl group, $R_3$ may be a $C_1$-$C_6$ carbonyloxyalkylene divalent chain, and $R_7$, $R_8$ and $R_9$ may each independently be $C_1$-$C_4$ alkyl groups, and $2 \leq m \leq 10{,}000$ and m is an integer.

At least one of the above and other features and advantages may also be realized by providing a method of forming a pattern, the method including forming a lower resist film; forming an upper resist film on the lower resist film by coating a photoresist composition thereon, the photoresist composition including a polymer, a photoacid generator, and a solvent, and the polymer including an alkoxysilyl group as a side chain and being cross-linkable by an acid to be insoluble in a developer; curing a first portion of the upper resist film by exposing the first portion to light, the exposed first portion being cured by a cross-linking reaction of the alkoxysily groups therein; providing a developer to the upper resist film to remove a second portion of the upper resist film that is not exposed to light, thereby forming a upper resist pattern on the lower resist film; and partially removing the lower resist film using the upper resist pattern as an etching mask to form a lower resist pattern, the lower and upper resist patterns forming a bilayer resist pattern structure on the substrate.

The method may further include forming an object layer on the substrate prior to forming the lower resist film; and partially removing the object layer using the bilayer resist pattern structure to form an object layer pattern on the substrate.

The method may further include forming a trench at an upper portion the substrate by an etching process using the bilayer resist pattern structure as an etching mask.

At least one of the above and other features and advantages may also be realized by providing a negative-type photoresist composition including a polymer including a repeating unit represented by Chemical Formula 1 or 2; a photo-acid generator; and a solvent,

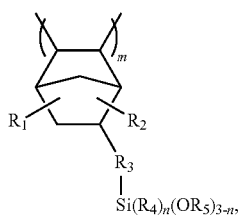

(1)

-continued

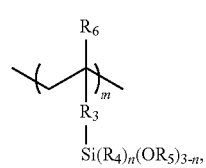

(2)

wherein, in Chemical Formulae 1 and 2, $R_1$, $R_2$ and $R_6$ may each independently be hydrogen, a $C_1$-$C_4$ alkyl group, a $C_1$-$C_4$ alkoxy group, or phenyl group, $R_3$ may be a divalent functional group including at least one of a $C_1$-$C_6$ alkylene chain, arylene, alkyleneoxy, arlyleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, and a $C_6$-$C_{30}$ unsaturated aliphatic divalent group, each $R_4$ may independently be a $C_1$-$C_{10}$ alkyl group, an aryl group, or a $C_2$-$C_6$ alkenyl group, each $R_5$ may independently be a $C_1$ to $C_4$ alkyl group, and $2 \leq m \leq 10{,}000$, $0 \leq n \leq 2$, m and n are integers, when n is 0 or 1, groups represented by $OR_5$ may be substantially the same as or different from each other, and when n is 2, groups represented by $R_4$ may be substantially the same as or different from each other.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
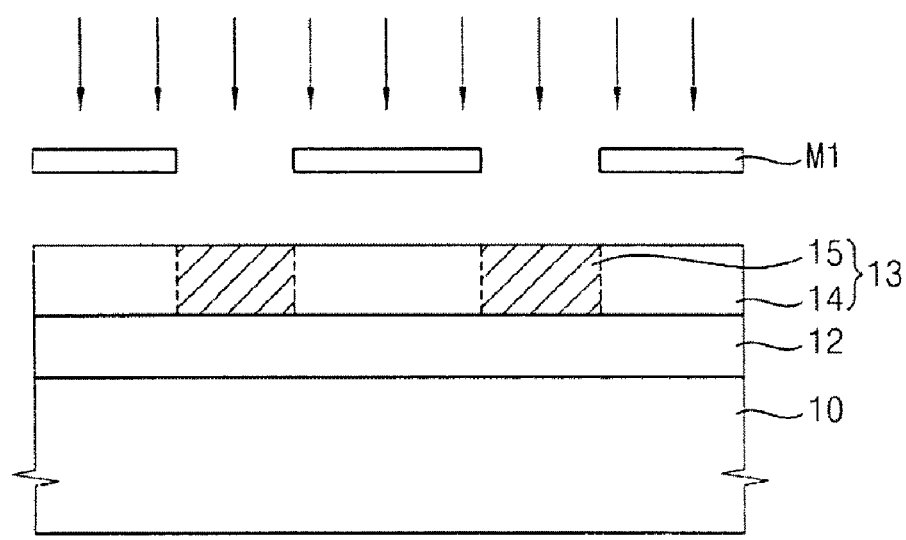
FIGS. 1 and 2 illustrate cross-sectional views of stages in a method of forming a pattern according to an embodiment.

Korean Patent Application No. 10-2009-0027541, filed on Mar. 31, 2009, in the Korean Intellectual Property Office, and entitled: "Negative-Type Photoresist Compositions and Methods of Forming a Pattern Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In example embodiments, "alkyl" denotes linear, branched, or ring-shaped saturated hydrocarbon chains, "alkenyl" indicates linear, branched, or ring-shaped hydrocarbon chains having unsaturated bonds, and "alkylene" means linear, branched or ring-shaped saturated divalent hydrocarbon chains. In an example embodiment, alkyl or alkylene may include 1 to 30 carbon atoms. Alternatively, alkyl or alkylene may include 1 to 10 carbon atoms. In an example embodiment, alkenyl may include 2 to 30 carbon atoms. Alternatively, alkenyl may include 2 to 10 carbon atoms. Alkyl, alkenyl and alkylene may be substituted with some substituents. Alternatively, alkyl, alkenyl and alkylene may be unsubstituted. For example, alkyl may include methyl, ethyl, propyl, isopropyl, butyl, t-butyl, cyclohexyl, etc. For example, alkenyl may include ethenyl, propenyl, butenyl, cyclohexenyl, etc.

In example embodiments, "aryl" represents aromatic hydrocarbon chains. Aryl may include one or more than one rings, and may include 3 to 30 carbon atoms. For example, aryl may include phenyl, naphthyl, anthracenyl, etc. Aryl may be substituted with some substituents. Alternatively, aryl may be unsubstituted. "Aliphatic" groups denote linear, branched or ring-shaped saturated or unsaturated hydrocarbon chains without aromatic ring structure. Aliphatic groups may be substituted with some substituents. Alternatively, aliphatic groups may be substituted with no substituents.

Negative-Type Photoresist Compositions

According to an embodiment, a photoresist composition may include a polymer, a photoacid generator, and a solvent. The polymer may have an alkoxysilyl group as a side chain and may be cross-linked by an acid to be insoluble in a developer solution. The photoresist composition may be hardened or cured by a cross-linking reaction between the alkoxysilyl groups in which acid generated from the photoacid generator may serve as a catalyst. A portion of the polymer exposed to light in an exposure process may undergo the cross-linking reaction at room temperature. Thus, an image pattern may be formed even without performing a post-exposure bake (PEB) process after the exposure process.

When the photoresist composition is exposed to light, an acid-catalyzed chain cross-linking reaction may occur in the exposed portions of the photoresist composition. Thus, the photoresist composition may be referred to as a chemically amplified photoresist. An exposed portion of the photoresist composition may be cured to form a pattern; and a non-exposed portion thereof may be soluble in a developer. Thus, the photoresist composition may be referred to as a negative-type photoresist.

The polymer may have various types of basic chain, i.e., backbone, structures. The basic chain may include, e.g., polyacrylate, polymethacrylate, polyvinylester, polyvinylether, polyolefin, polystyrene, polynorbornene, polyester, polyamide, polycarbonate, etc.

The alkoxysilyl group may include, e.g., trimethoxysilyl, triethoxysilyl, triisopropoxysilyl, tritertiarybutoxysilyl, dimethoxymethylsilyl, dimethoxyethylsilyl, dimethoxypropylsilyl, dimethoxybutylsilyl, diethoxymethylsilyl, diethoxyethylsily, diethoxypropylsilyl, diethoxybutylsilyl, diisopropoxymethylsilyl, ditertiarybutoxymethylsilyl, methoxydimethylsilyl, methoxydiethylsilyl, ethoxydiethylsilyl, isopropoxydimethyldiethylsilyl, etc.

In an implementation, the polymer may include a repeating unit represented by at least one of the following Chemical Formulae 1 and 2.

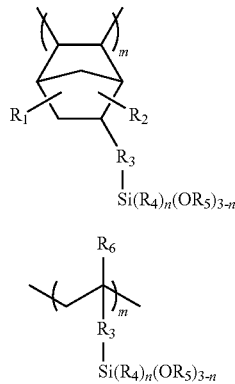

In Chemical Formulae 1 and 2, $R_1$, $R_2$ and $R_6$ may each independently be, e.g., hydrogen, a $C_1$-$C_4$ alkyl group, a $C_1$-$C_4$ alkoxy group, or phenyl group. $R_3$ may be a divalent functional group including, e.g., a $C_1$-$C_6$ alkylene chain, arylene, alkyleneoxy, arlyleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, a $C_6$-$C_{30}$ unsaturated aliphatic divalent group, and/or combinations thereof. $R_4$ may be, e.g., a $C_1$-$C_{10}$ alkyl group, an aryl group, or a $C_2$-$C_6$ alkenyl group. $R_5$ may be, e.g., a $C_1$-$C_4$ alkyl group. Here, $2 \leq m \leq 10,000$, $0 \leq n \leq 2$, and m and n are integers. When n is 0 or 1, groups represented by $OR_5$ may be substantially the same as or different from each other. When n is 2, groups represented by $R_4$ may be substantially the same as or different from each other.

In Chemical Formulae 1 and 2, $R_1$, $R_2$ and $R_6$ may each independently be, e.g., hydrogen, methyl, ethyl propyl, propyl, methoxy, ethoxy, phenyl, etc. $R_1$ and $R_2$ may be substantially the same as or different from each other. $R_3$ may be, e.g., carbonyloxy, carbonyloxypropylene, carbonyloxyethylene, carbonyloxyethylene, carbonyloxymethylene, carbonyloxybutylene, hexylene, cyclohexylene, phenylene, oxycarbonylpropylene, oxycarbonylpropyloxy, carbonyloxyphenylene, phenyleneoxy, phenyleneoxycarbonyl, oxypropylene, etc. $R_4$ may be, e.g., methyl, ethyl, propyl, butyl, hexyl, octyl, phenyl, etc. $R_5$ may be, e.g., methyl, ethyl, n-propyl, isopropyl, n-butyl, t-butyl, etc.

In another implementation, the polymer may include a repeating unit represented by following Chemical Formula 3.

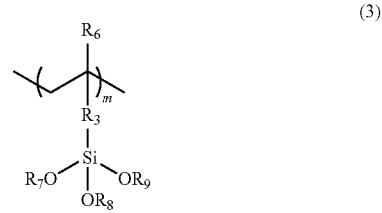

In Chemical Formula 3, $R_6$ may be, e.g., hydrogen, a $C_1$-$C_4$ alkyl group, a $C_1$-$C_4$ alkoxy group, or phenyl group. $R_3$ may be a divalent functional group including, e.g., a $C_1$-$C_6$ alkylene chain, arylene, alkyleneoxy, arlyleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, a $C_6$-$C_{30}$ unsaturated aliphatic divalent group, and/or combinations thereof. $R_7$, $R_8$ and $R_9$ may each independently be, e.g., a $C_1$-$C_4$ alkyl group. Here, $2 \leq m \leq 10,000$, and m is an integer.

In an implementation, the polymer may include, e.g., polymerized (trialkoxysilyl)alkyl methacrylate. In another implementation, the polymer may include, e.g., a copolymer of (trialkoxysilyl)alkyl methacrylate and another methacrylate monomer (e.g, gamma-butyrolactonyl methacrylate, methylmethacrylate, etc.). In still another implementation, the polymer may include a copolymer of 3-(trimethoxysilyl) propylacrylate and gamma-butyrolactonyl methacrylate. In other words, the repeating units represented by Chemical Formulae 2 or 3 may include 3-(trimethoxysilyl) propylacrylate.

In an implementation, the photoresist composition may include a copolymer having a first repeating unit and a second repeating unit. The first repeating unit may include the alkoxysilyl group as a side chain. The second repeating unit may include, e.g., acrylate-based, methacrylate-based, acrylic acid, methacrylic acid, vinyl ester-based, vinyl ether-based, vinyl alcohol-based, vinyl halide-based, olefine-based, cyclic olefine-based, styrene-based, norbornene-based, polyester-based, polyamide-based, polycarbonate-based, maleicacid anhydride, unsaturated anhydride-based, etc. These may be used alone or in a combination thereof.

The polymer may be prepared by, e.g., radical polymerization of an unsaturated monomer having an alkoxysilyl group as a side chain. In another implementation, the polymer may be prepared by, e.g., copolymerization of the unsaturated monomer having the alkoxysilyl group as the side chain and other kinds of unsaturated monomers. Initiators may include, e.g., benzoyl peroxide, 2,2-azobisisobutyronitrile, acetyl peroxide, lauryl peroxide, t-butylperacetate, t-butylhydroperoide, di-tertiary-butylperoxide, etc. Solvent for the polymerization may include, e.g., cyclohexanone, cyclopentanone, tetrahydrofuran, dimethylformamide, 1,4-dioxane, methylethylketone, benzene, toluene, etc. These may be used alone or in a mixture thereof.

The polymer may have weight-average molecular weight of about 5,000 to about 500,000. The molecular weight of the polymer may be controlled in consideration of, e.g., viscosity, coating coverage, pattern resolution, pattern profile, curing kinetics, etc., of the photoresist composition.

An alkoxysilyl group ($Si-OR_5$) of the polymer may react with moisture in the air or in the photoresist composition to be hydrolyzed when the acid is generated from the photoacid generator. A hydroxysilyl group (Si—OH) generated by hydrolysis of the alkoxysilyl group may be cross-linked with adjacent hydroxysilyl groups by condensation. For example, a cross-linking reaction of poly 3-(trimethoxysilyl)propylacrylate in the presence of acidic catalysts may be represented by the following Reaction Scheme 1:

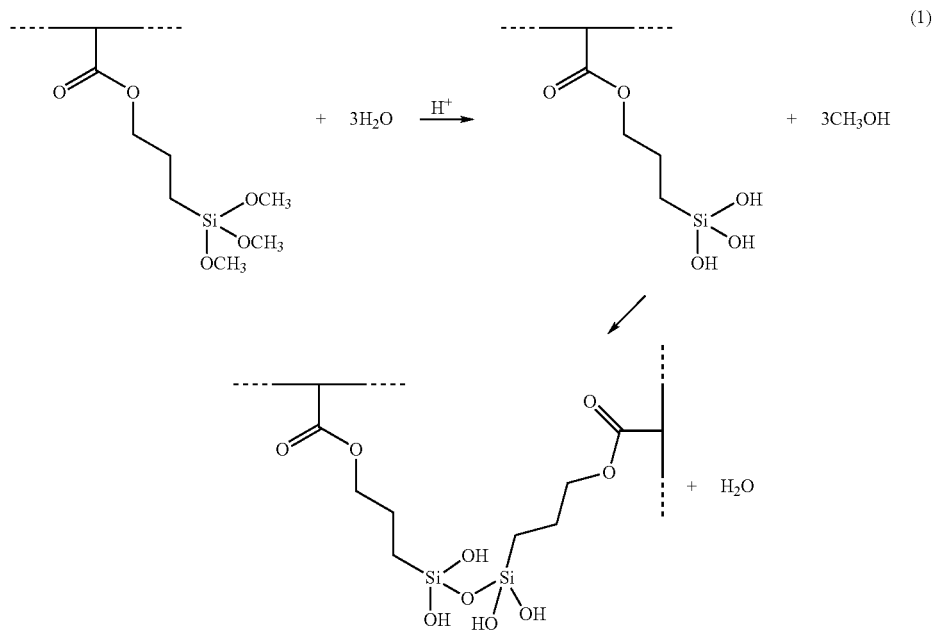

(1)

The hydrolysis and the condensation of the alkoxysilyl groups may be conducted at, e.g., room temperature. The polymer exposed to light may be cured by the acid generated during the exposure process without providing heat. A portion of the polymer cured in the exposure process may be insoluble in the developer so that an image pattern may be formed in a subsequent developing process. The developer may not, or only minimally, dissolve a cross-linked portion of the polymer, and may dissolve a non-cross-linked portion thereof. The developer may include organic solvents, e.g., ketone, ether, alcohol, etc. These may be used alone or in a mixture thereof. In an implementation, the developer may include, e.g., cyclohexanone, propylene glycol monomethylether acetate, diacetone alcohol, etc.

The exposed portion of the photoresist composition may be cured by an acid catalyst without a post-exposure bake (PEB) process. Thus, the acid may be prevented from diffusing into the non-exposed portion of the photoresist composition due to the heat during the post-exposure bake (PEB) process, so that roughness and profile characteristics of patterns of the photoresist composition may be improved.

In an implementation, an alkoxysilyl group may not be acid-labile, i.e., a group that may break away from the polymer by the acid, but rather may remain bonded to the polymer in the cross-linking reaction. As a result, a photoresist pattern of the polymer may contain silicon atoms, thereby ensuring a higher etching resistance than other organic photoresists. Thus, the photoresist pattern may be used as an upper resist pattern of a bilayer photoresist pattern structure serving as a mask in a photolithography process. The bilayer photoresist pattern structure may be a spin-on hard mask, and may include a lower resist pattern and an upper resist pattern. The lower resist pattern may have a relatively thick thickness, and may have anti-reflectivity and/or etching resistance. The upper resist pattern may have a relatively thin thickness. The lower resist pattern may be used for planarization, and the upper resist pattern may be used for imaging. The photoresist composition may be coated by a spin-coating process and have a high etching resistance due to the presence of silicon atoms, and thus the photoresist composition may serve as the upper resist pattern.

The polymer may be included in an amount of about 0.1 to about 40% by weight, based on a total weight of the photoresist composition. In an implementation, the polymer may be included in an amount of about 0.1 to about 20% by weight. However, the amount of the polymer may be adjusted in consideration of the desired usage of the photoresist composition.

The photoacid generator may include a compound that generate an acid when exposed to light. The photoacid generator may include, e.g., onium salt, aromatic diazonium salt, sulfonium salt, triarylsulfonium salt, diarylsulfonium salt, monoarylsulfonium salt, iodonium salt, diaryliodonium salt, nitrobenzyl ester, disulfone, diazo-disulfone, sulfonate, trichoromethyl triazine, N-hydroxysuccimide triflate, etc. In an implementation, the photoacid generator may include, e.g., phthalimidotrifluoromethanesulfonate, dinitrobenzyltosylate, n-decyldisulfone, naphthylimidotrifluoromethanesulfonate, diphenyliodo hexafluorophosphate, diphenyliodo hexafluoroarsenate, diphenyliodo hexafluoroantimonate, diphenyl p-methoxyphenyl triflate, diphenyl p-toluenyl triflate, triphenylsulfonium triflate or dibutylnaphthylsulfonium triflate, etc. These may be used alone or in a mixture thereof.

The photoacid generator may be included in an amount of about 0.01 to about 20% by weight, based on a total weight of the polymer. Maintaining the amount of the photoacid generator at about 0.01% by weight or greater may help ensure that light sensitivity of the photoresist composition is not reduced. Maintaining the amount of the photoacid generator at about 20% by weight or less may help ensure that the photoacid generator does not absorb too much light, thereby ensuring good surface quality of a pattern of the photoresist composition. In an implementation, the photoacid generator may be included in an amount of about 0.001 to about 10% by weight, based on a total weight of the photoresist composition. The amount of the photoacid generator may be adjusted in consideration of the desired quality of the pattern.

The solvent may dissolve the polymer and the photoacid generator. The solvent may include an organic solvent. In an implementation, the solvent may include, e.g., alkyleneglycol alkylether, alkyleneglycol alkylester, alkyleneglycol alkylether ester, ester, ether, ketone, etc. For example, the solvent may include diethyleneglycol diethylether, methyl 3-methoxy propionate, ethyl 3-ethoxy propionate, propyleneglycol methylether acetate, cyclohexanone, 2-heptanone, ethyl lactate, etc. These may be used alone or in a mixture thereof.

The solvent may be included in an amount of about 10 to about 1,000% by weight, based on a total weight of the polymer. In an implementation, the solvent may be included in an amount of about 50 to about 99.899% by weight, based on a total weight of the photoresist composition. In another implementation, the solvent may be included in an amount of about 80 to about 99.899% by weight, based on a total weight of the photoresist composition. The amount of the solvent may be adjusted in consideration of the desired usage of the photoresist composition.

The photoresist composition may be prepared by dissolving the polymer and photoacid generator in the solvent. The photoresist composition may further include additives, e.g., silane coupling agents, dyes, surfactant, fillers, viscosity modifiers, etc. The fillers may include, e.g., barium sulfate, talc, glass bubbles, etc., and the viscosity modifiers may include, e.g., silica.

Methods of Forming a Pattern

Figure 2:
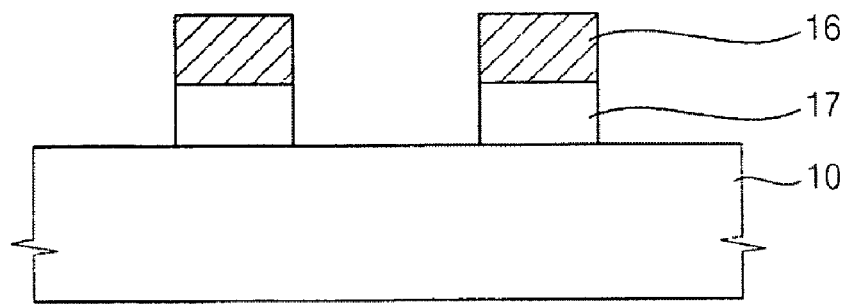

FIGS. 1 and 2 illustrate cross-sectional views of stages in a method of forming a pattern according to an embodiment.

Referring to FIG. 1, an object layer 12 may be formed on a substrate 10. Then, a photoresist film 13 may be formed on the object layer 12.

The substrate 10 may include, e.g., a semiconductor substrate, a silicon-on-insulator (SOI) substrate, a glass substrate, a ceramic substrate, a printed circuit board, a polymer plate, a metal plate, etc. Structures, e.g., devices, wirings, patterns, layers, halls, trenches, etc., may be further formed on the substrate 10 prior to forming the object layer 12 on the substrate 10.

Images may be transferred from the photoresist film 13 to the object layer 12. The object layer 12 may include, e.g., a mask layer, a hard mask layer, an insulating layer, a conduction layer, an oxide layer, a nitride layer, an oxynitride layer, a metal layer, a metal nitride layer, a semiconductor layer, a polymer layer, etc. The object layer 12 may be formed by a deposition process, e.g., a chemical vapor deposition (CVD) process, a physical vapor deposition (PVD) process, an atomic layer deposition (ALD) process, etc., or a coating process.

The photoresist film 13 may be formed on the object layer 12 using the photoresist composition of an embodiment. Thus, the photoresist film 13 may be formed by coating the photoresist composition including the polymer having the alkoxysilyl group, the photoacid generator, and the solvent. The photoresist film 13 may be formed by a coating process, e.g., a spin coating process, a spray coating process, a deep coating process, etc. The solvent may be removed by evaporation.

An upper surface of the photoresist film 13 may be exposed to light, which has been filtered by a photomask M1. Thus, images of the photomask M1 may be transferred to the photoresist film 13. A portion of the photoresist film 13 exposed to the light may be referred to as an exposed portion 15; and a portion of the photoresist film 13 not exposed to the light may be referred to as a non-exposed portion 14. The light may be provided by, e.g., an argon fluoride laser, a krypton fluoride laser, an electron beam, X-rays, a mercury-xenon lamp, G-line rays, I-line rays, ultraviolet rays, deep ultraviolet rays, radiation rays, etc.

In the exposed portion 15, the polymer may be cured by a cross-linking reaction of the alkoxysilyl groups in which acid generated from the photoacid generator may serve as a catalyst. As shown in Reaction Scheme 1, the alkoxysilyl groups may react with moisture in the air or in the photoresist composition in the presence of the acidic catalyst to be hydrolyzed. A hydroxysilyl group (Si—OH) may be cross-linked with adjacent hydroxysilyl groups by condensation. The hydrolysis and the condensation of the alkoxysilyl groups may be conducted at room temperature. Thus, image patterns may be formed without performing a post-exposure baking (PEB) process for activating the reaction caused by the acid.

Curing the exposed portion 15 of the photoresist film 13 may be performed at such a low temperature that the acid generated in the exposed portion 15 may be prevented from diffusing to the non-exposed portion 14. In an implementation, the hydrolysis and the condensation of the alkoxysilyl groups may be conducted at a temperature of about 5° C. to about 60° C. Preferably, the hydrolysis and the condensation are performed at a temperature of about 10° C. to about 50° C. More preferably, the hydrolysis and the condensation are performed at a temperature of about 10° C. to 40° C. Most preferably, the hydrolysis and the condensation are performed at a temperature of about 10° C. to 30° C. The exposed portion 15 of the photoresist film 13 may be cured at a low temperature, e.g., lower than about 50° C., such that the acid generated in the exposed portion 15 may be prevented from diffusing to the non-exposed portion 14. Accordingly, undesirable transformation of pattern profile and/or increase of line width roughness may be prevented or reduced.

Referring to FIG. 2, a developing process may be performed on the substrate 10 to remove the non-exposed portion 14 of the photoresist film 13, so that a photoresist pattern 16 including the exposed portion 15 may be formed on the object layer 12. The polymer in the exposed portion 15 that has been cross-linked may be insoluble in a developer, thereby forming the photoresist pattern 16. The polymer in the non-exposed portion 14 may be soluble in the developer and therefore easily removed. The developer may include materials for dissolving the polymer. In particular, the developer may include an organic solvent, e.g., ketone, acetate, ether, alcohol, etc. These organic solvents may be used alone or in a mixture thereof. In an implementation, the developer may include, e.g., cyclohexanone, propylene glycol monomethylether acetate, diacetone alcohol, etc.

Portions of the object layer 12 may be removed using the photoresist pattern 16 as an etching mask to form an object layer pattern 17 on the substrate 10. The object layer pattern 17 may be formed by, e.g., a dry etching process or a wet etching process.

Alternatively, the photoresist pattern 16 may be directly formed on the substrate 10, and the substrate 10 itself may be patterned using the photoresist pattern 16 as an etching mask. In this case, images of the photoresist pattern 16 may be transferred to an upper surface of the substrate 10, e.g., as a trench or a hall.

Figure 3:
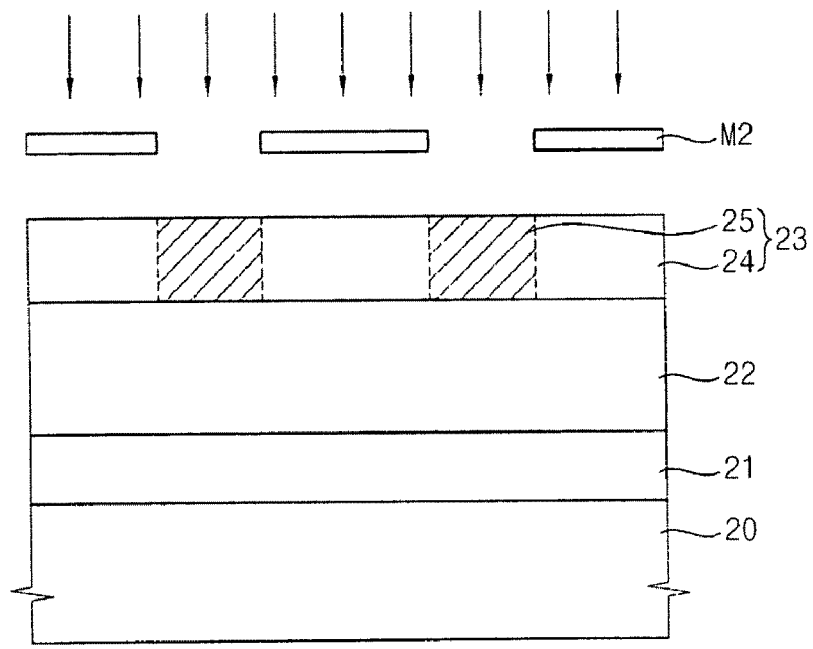
FIGS. 3 to 5 illustrate cross-sectional views of stages in a method of forming a bilayer photoresist pattern structure according to another embodiment.
Figure 4:
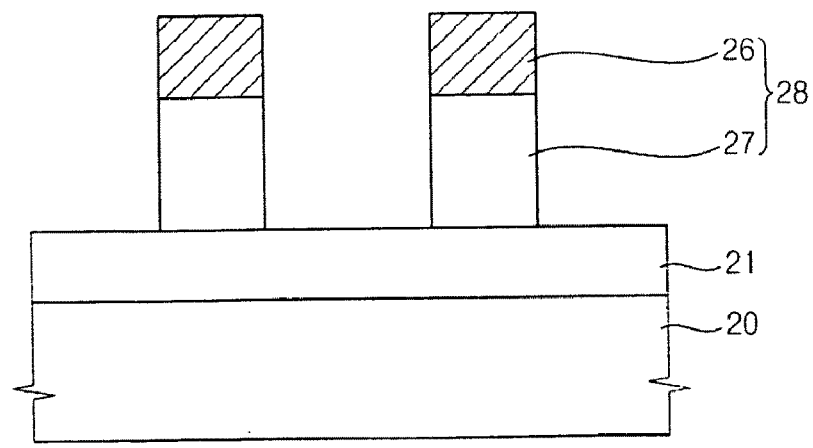
Figure 5:
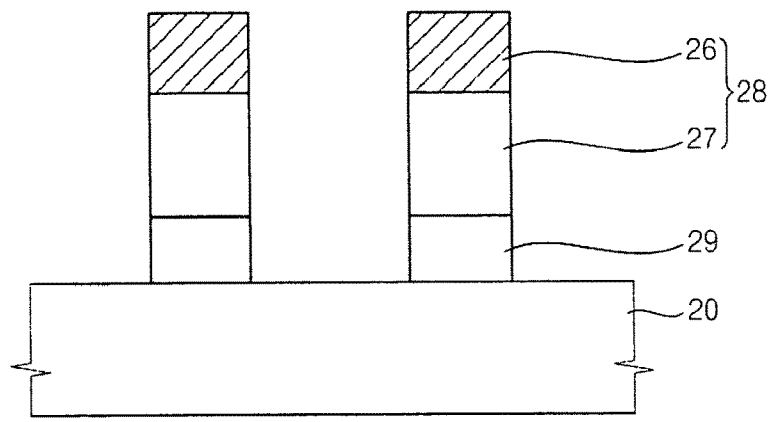

FIGS. 3 to 5 illustrate cross-sectional views of stages in a method of forming a bilayer photoresist pattern structure according to an embodiment.

Referring to FIG. 3, an object layer 21, a lower resist film 22, and an upper resist film 23 may be sequentially formed on a substrate 20. The substrate 20 and the object layer 22 may be substantially the same as or similar to the substrate 10 and the object layer 11 of FIG. 1, respectively. When the substrate 20 itself is intended to be patterned, the object layer 21 may be omitted. In this case, a photoresist pattern corresponding to e.g., a hall or a trench, may be formed on the substrate 20.

The lower resist film 22 and the upper resist film 23 may define a bilayer photoresist layer structure. The lower resist film 22 may have a relatively thick thickness and may have anti-reflectivity and/or etching resistance. The upper resist film 23 may have a relatively thin thickness. The lower resist film 22 may be used for planarization; and the upper resist film 23 may be used for imaging.

The lower resist film 22 may be formed from organic materials, e.g., an organic mask material, an organic photoresist, and/or an anti-reflective coating material. In an implementation, the lower resist film 22 may include, e.g., an aromatic organic composition including phenol resin, novolac resin, etc. The lower resist film 22 may be formed by a coating process, e.g., a spin coating process, a spray coating process, a deep coating process, etc. When an upper surface of the substrate 20 is not even, the lower resist film 22 may be formed to have a thick thickness so that the upper surface of the substrate 20 may be even.

The upper resist film 23 may be formed using the photoresist composition of an embodiment. The photoresist composition may contain silicon, thereby having a high etching resistance even though the upper resist film 23 may be thinly coated on the lower resist film 22. Thus, the upper resist film 23 may be patterned to form a photoresist pattern having a high resolution, even with a relatively thin thickness. The upper resist film 23 may be formed by coating the photoresist composition including the polymer having the alkoxysilyl group, the photoacid generator, and the solvent. The photoresist composition may be coated by, e.g., a spin-coating process.

An upper surface of the upper resist film 23 may be exposed to light that has been filtered by a photomask M2. Thus, images of the photomask M2 may be transferred to the upper photoresist film 23. A portion of the upper photoresist film 23 exposed to the light may be referred to as an exposed portion 25; and a portion of the upper photoresist film 23 not exposed to the light may be referred to as a non-exposed portion 24. The polymer of the exposed portion 25 may be cured by a cross-linking reaction of the alkoxysilyl groups, in which acid generated from the photoacid generator may serve as the catalyst. The polymer in the exposed portion 25 may be cured during the exposure process because the hydrolysis and condensation may be conducted at a low temperature, e.g., room temperature, in the presence of the acidic catalyst. Thus, image patterns may be formed without performing a post-exposure baking (PEB) process for activating the reaction caused by the acid.

Referring to FIG. 4, a developing process may be performed on the upper resist film 23 to remove the non-exposed portion 24 thereof. Thus, an upper resist pattern 26 including the exposed portion 25 may be formed on the object layer 21. Portions of the lower resist film 22 may be removed using the upper resist pattern 25 as an etching mask to form a lower resist pattern 27 on the object layer 21. Thus, a bilayer resist pattern structure 28 including the upper resist pattern 26 and the lower resist pattern 27 may be formed on the object layer 21.

Portions of the lower resist film 22 may be removed by, e.g., a dry etching process or a wet etching process. In an implementation, portions of the lower resist film 22 may be removed by, e.g., an etching process using oxygen plasma. The upper resist pattern 26 may have an etching resistance to oxygen plasma higher than that of the lower resist film 22, because the upper resist pattern 26 may contain silicon.

Referring to FIG. 5, portions of the object layer 21 may be removed using the bilayer resist pattern structure 28 as an etching mask to form an object layer pattern 29 on the substrate 20. The object layer pattern 29 may be formed by, e.g., a dry etching process or a wet etching process. In an alternative implementation, the bilayer photoresist pattern structure 28 may be directly formed on the substrate 20; and the substrate 20 itself may be patterned using the bilayer photoresist pattern structure 28 as an etching mask. In this case, images of the bilayer photoresist pattern structure 28 may be transferred to an upper surface of the substrate 20, e.g., as a trench or a hall.

The method of forming patterns according to an embodiment may be used for forming a micro pattern of, e.g., integrated circuits, memory devices, printed circuit boards, microelectromechanical systems (MEMS), micro machine, display devices, image display devices, etc. In an implementation, the method may be used for forming a pattern of, e.g., a trench, a contact hole, a pad, a plug, a word line, a bit line, an insulation layer, etc.

Methods of Manufacturing Semiconductor Devices

FIGS. 6 to 9 illustrate cross-sectional views of stages in a method of manufacturing a dynamic random access memory (DRAM) device according to an embodiment.

Figure 6:
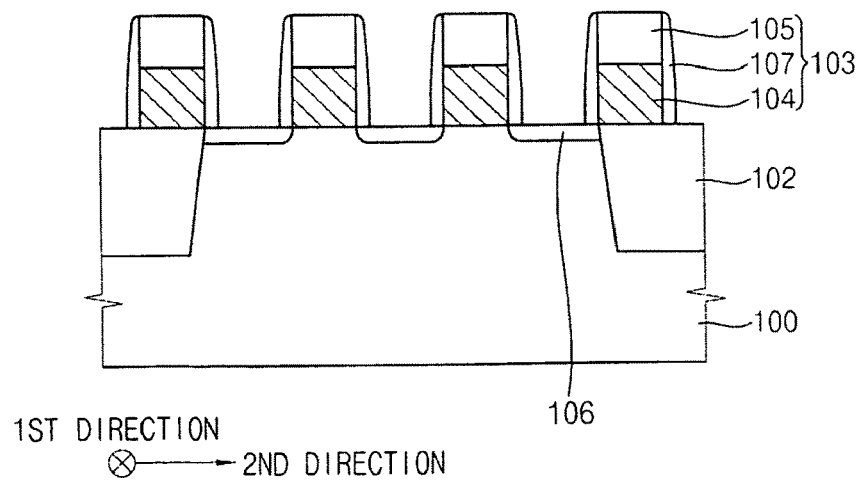
FIGS. 6 to 9 illustrate cross-sectional views of stages in a method of manufacturing a dynamic random access memory (DRAM) device according to an embodiment.

Referring to FIG. 6, an isolation layer 102 may be formed on a substrate 100 by a shallow trench isolation (STI) process. In particular, a pad oxide layer (not shown), a mask film (not shown), and a photoresist pattern (not shown) may be sequentially formed on the substrate 100. The mask film and the pad oxide layer may be patterned using the photoresist pattern as an etching mask to form a mask (not shown) and a pad oxide layer pattern (not shown) on the substrate 100. The photoresist pattern may be removed by, e.g., an ashing process and/or a stripping process; and portions of the substrate 100 may be removed using the mask as an etching mask to form a trench (not shown) at an upper portion of the substrate 100. An insulating material may be filled into the trench to form the isolation layer 102.

The photoresist pattern may be formed on the mask film using the photoresist compositions by the methods of forming a pattern according to an embodiment. That is, a photoresist film (not shown) including the photoresist composition may be formed on the mask film; and portions of the photoresist film may be removed by an exposure process and a developing process, thereby forming the photoresist pattern. Repeated detailed explanations about the photoresist composition, the exposure process, and the developing process are omitted here.

A gate structure 103 may be formed on the substrate 100 having the isolation layer 102 thereon. In an implementation, a plurality of gate structures 103 may be formed on the substrate 100. Each gate structure 103 may extend in a first direction, and may include a gate insulation layer (not shown), a gate electrode 104, a gate mask 107, and a gate spacer 106. The photoresist compositions and the method of forming a pattern in accordance with an embodiment may be used in a pattering process for forming the gate structure 103.

An impurity region 106 may be formed at an upper portion of the substrate 100 adjacent to the gate structure 103 by an ion implantation process. In an implementation, a plurality of impurity regions 106 may be formed and may serve as source/drain regions. The gate structure 103 and the source/drain regions 106 may define a transistor.

Figure 7:
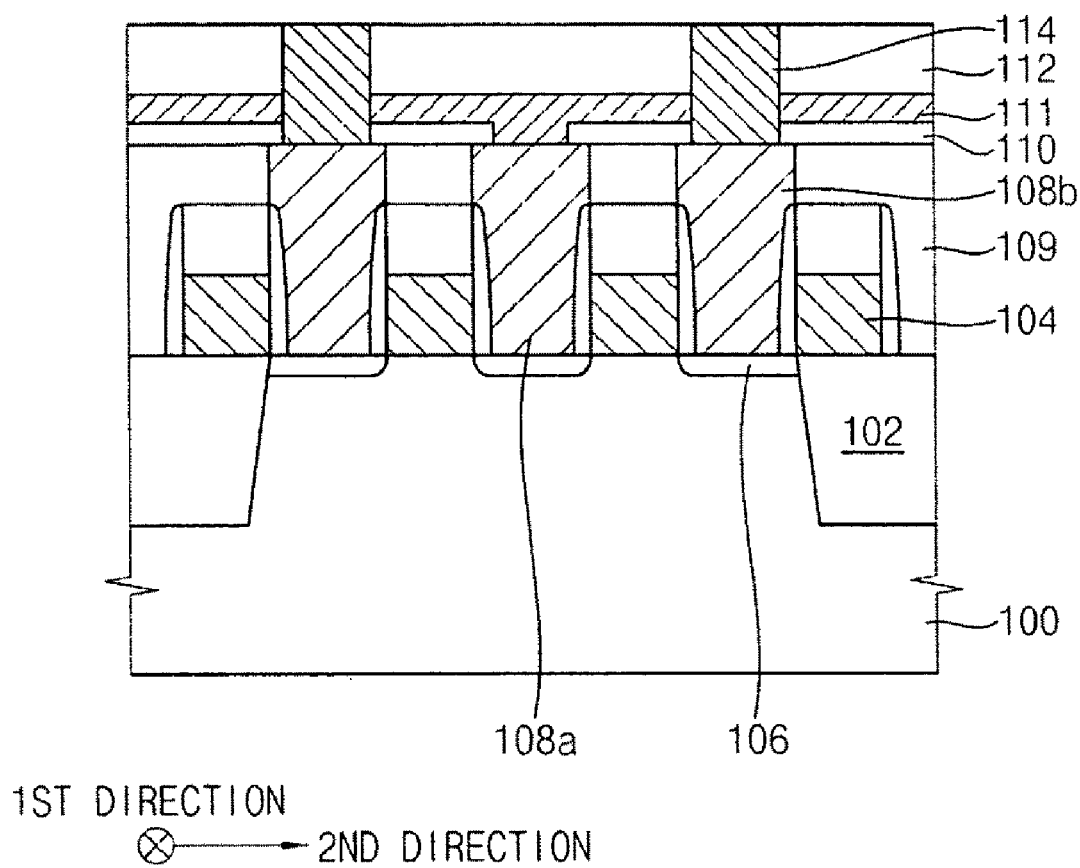

Referring to FIG. 7, a first insulating interlayer 109 may be formed on the substrate 100 to cover the transistor. The first insulating interlayer 109 may be partially etched to form first openings (not shown) through the first insulating interlayer 109, thereby exposing the impurity regions 106. A first conductive layer may be formed on the impurity regions 106 and the first insulating interlayer 109 to fill the first openings. An upper portion of the first conductive layer may be planarized until a top surface of the first insulating interlayer 109 is exposed, thereby forming a first plug 108a and second plugs 108b. The first and second plugs 108a and 108b may be electrically connected to the impurity regions 106. The photoresist compositions and the methods of forming a pattern according to an embodiment may be used in the etching process of the first insulating interlayer 109 for forming the first openings.

A second insulating interlayer 110 may be formed on the first insulating interlayer 109 and the plugs 108a and 108b. The second insulating interlayer 110 may be partially removed to form a hole (not shown) therethrough exposing the first plug 108a. A second conductive layer may be formed on the first plug 108a and the second insulating interlayer 110 to fill the hole. The second conductive layer may be patterned to form a bit line 111 on the second insulating interlayer 110, which may be electrically connected to the first plug 108a. In an implementation, the bit line 110 may extend in a second direction perpendicular to the first direction.

A third insulating interlayer 112 may be formed on the second insulating interlayer 110 to cover the bit line 111. The third insulating interlayer 112 and the second insulating interlayer 110 may be partially etched to form second openings (not shown) therethrough exposing the second plugs 108b. The photoresist compositions and the method of forming a pattern in accordance with an embodiment may be used in the etching process of the third insulating interlayer 112 for forming the second openings. A third conductive layer may be formed on the second plugs 108b and the third insulating interlayer 112 to fill the second openings. An upper portion of the third conductive layer may be planarized until a top surface of the third insulating interlayer 112 is exposed, thereby forming third plugs 114.

Figure 8:
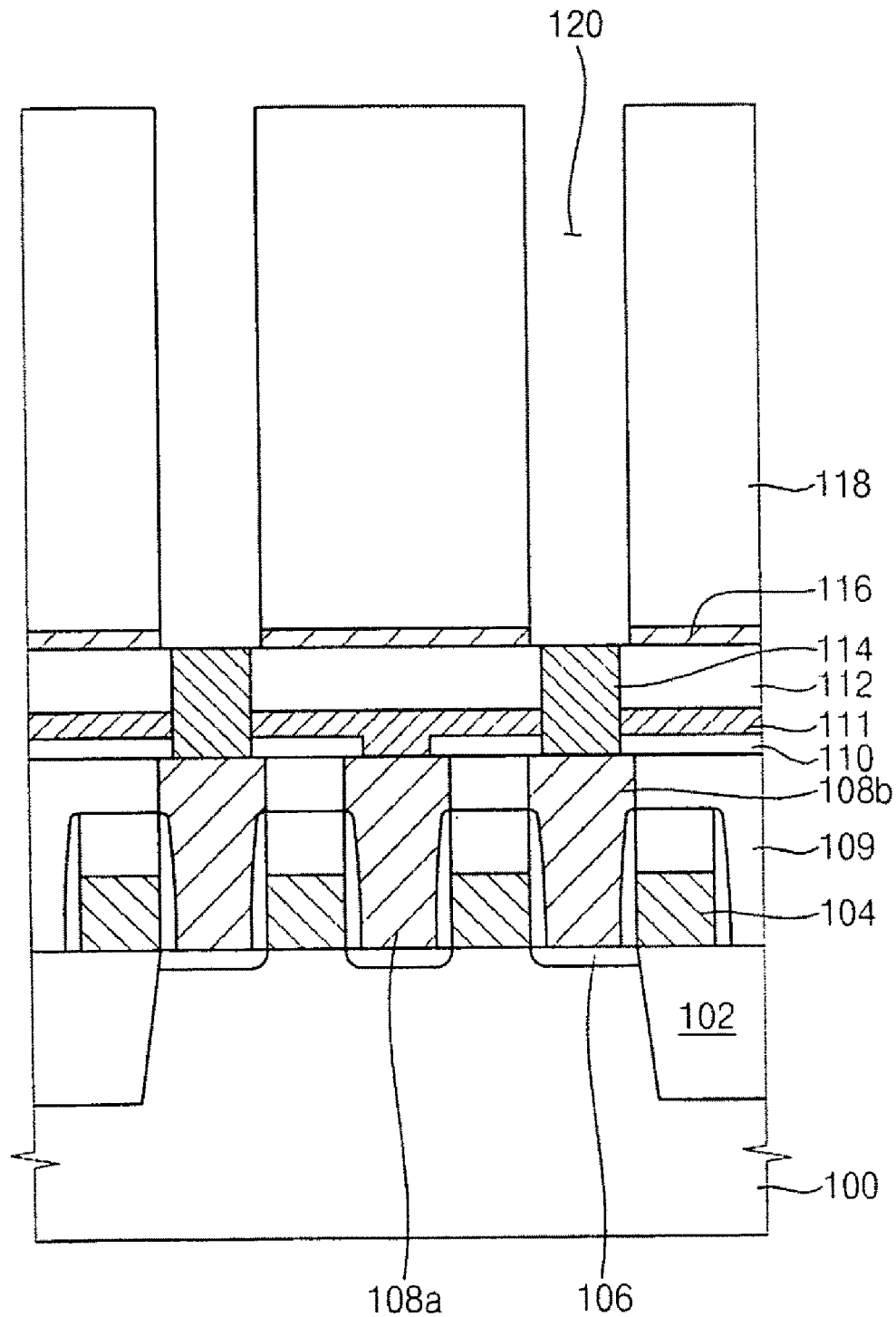

Referring to FIG. 8, an etch stop layer 116 may be formed on the third insulating interlayer 112 and the third plugs 114. A mold layer 118 may be formed on the etch stop layer 116. The etch stop layer 116 may be formed using a material having an etching selectivity with respect to the mold layer 118, e.g., silicon nitride. The mold layer 118 may be formed using an oxide, e.g., tetraethyl orthosilicate (TEOS), phosphor silicate glass (PSG), undoped silicate glass (USG), borophospho silicate glass (BPSG), silicon on glass (SOG), and/or high density plasma chemical vapor deposition (HDP-CVD) oxide.

Third openings 120 exposing upper surfaces of the third plugs 114 may be formed by partially etching the mold layer 118 and the etch stop layer 116. The photoresist compositions and methods of forming a pattern in accordance with an embodiment may be used in the etching process of the mold layer 118.

Figure 9:
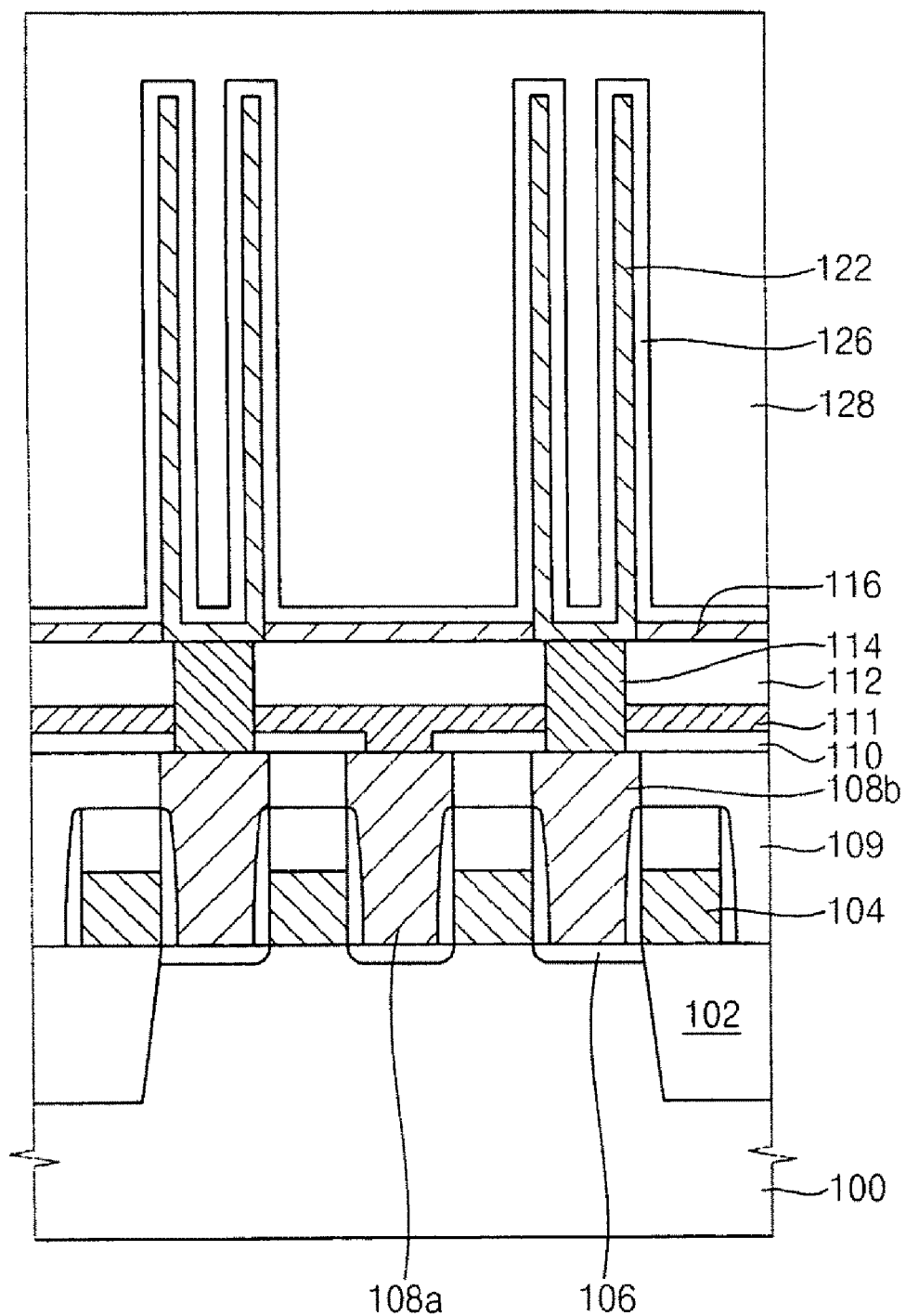

Referring to FIG. 9, a fourth conductive layer may be formed on bottoms and sidewalls of the third openings 120 as well as on an upper surface of the mold layer 118. The third conductive layer may be formed using a conductive material, e.g., a metal or a metal nitride. A buffer layer (not shown) may be formed on the third conductive layer to fill remaining portions of the third openings 120. Upper portions of the buffer layer and the third conductive layer may be planarized until the upper surface of the mold layer 118 is exposed, thereby forming a lower electrode 122 on the bottoms and the sidewalls of the third openings 120. The mold layer 118 and the buffer layer may be removed to expose sidewalls of the lower electrode 122.

A dielectric layer 126 and an upper electrode 128 may be sequentially formed on the lower electrode 122 and the etch stop layer 116. Thus, capacitors, each including the lower electrode 122, the dielectric layer 126, and the upper electrode 128, may be formed on the third insulating interlayer 112 to be electrically connected to the third plug 114. The dielectric layer 126 may be formed using, e.g., silicon oxide or an oxide having a high dielectric constant. The upper electrode 128 may be formed using a conductive material, e.g., a metal or a metal nitride. Wirings (not shown) may be further formed on the upper electrode 128 to form the DRAM device.

FIGS. 10 to 14 illustrate cross-sectional views of stages in a method of manufacturing a flash memory device according to an embodiment.

Figure 10:
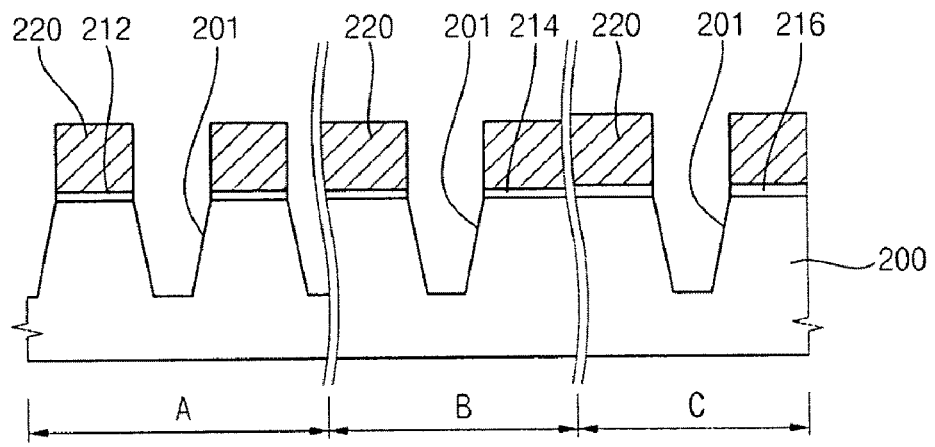
FIGS. 10 to 14 illustrate cross-sectional views of stages in a method of manufacturing a flash memory device according to an embodiment.

Referring to FIG. 10, first, second and third dielectric layer patterns 212, 214, and 216 and a first conductive layer pattern 220 may be sequentially formed on a substrate 200, which may be divided into a cell region A and core/peripheral regions B and C. In the core/peripheral regions B and C, the region B may indicate a low-voltage transistor region; and the region C may indicate a high-voltage transistor region. The first, second, and third dielectric layer patterns 212, 214, and 216 may be formed in the cell region A, in the low-voltage transistor region B, and in the high-voltage transistor region C, respectively.

The dielectric layer patterns 212, 214, and 216 and the first conductive layer pattern 220 may be formed by a deposition process and an etching process. Particularly, a dielectric layer and a first conductive layer may be sequentially formed on the substrate 200. The dielectric layer may be formed by, e.g., a thermal oxidation process. In an implementation, the dielectric layer may have a relatively small thickness in the cell region A and the low-voltage transistor region B, and a relatively large thickness in the high-voltage transistor region C. The first conductive layer may be formed using a conductive material, e.g., polysilicon, a metal, etc.

The photoresist compositions and methods of forming a pattern in accordance with an embodiment may be used in patterning the dielectric layer and the first conductive layer. Particularly, a photoresist film (not shown) may be formed on the first conductive layer using the photoresist composition. The photoresist film may be exposed to light; and an exposed portion of the photoresist film may be cured. A non-exposed portion of the photoresist film may be removed by a developer to form the photoresist pattern (not shown). The first conductive layer and the dielectric layer may be patterned using the photoresist pattern as an etching mask, thereby forming the first conductive layer pattern 220 and the dielectric layer patterns 212, 214, and 216, respectively. In an implementation, each of the first conductive layer pattern 220 and the dielectric layer patterns 212, 214, and 216 may extend in a first direction. The photoresist pattern may be removed by, e.g., an ashing and/or a stripping process.

Portions of the substrate 200 may be removed using the first conductive layer pattern 220 as an etching mask to form a plurality of trenches 201 on the substrate 200.

Figure 11:
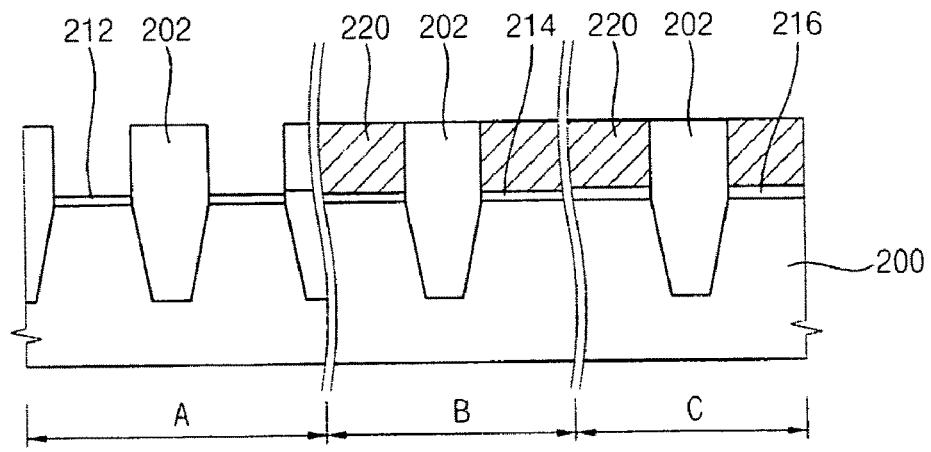

Referring to FIG. 11, a plurality of isolation layers 202 may be formed in the trenches 201. Particularly, an insulating layer may be formed on the trenches 201 and the first conductive layer pattern 220 to fill the trenches 201. An upper portion of the insulating layer may be planarized until a top surface of the first conductive layer pattern 220 is exposed, thereby forming the isolation layers 202 in the trenches 201. In an implementation, each isolation layers 202 may extend in the first direction.

A first portion of the first conductive layer pattern 220 in the cell region A may be removed, so that the first dielectric layer pattern 212 may be exposed. When the first portion of the first conductive layer pattern 220 is removed, second and third portions of the first conductive layer pattern 220 in the core/peripheral regions B and C may be covered by a photosensitive mask. The photosensitive mask may be formed using the photoresist compositions in accordance with an embodiment.

Figure 12:
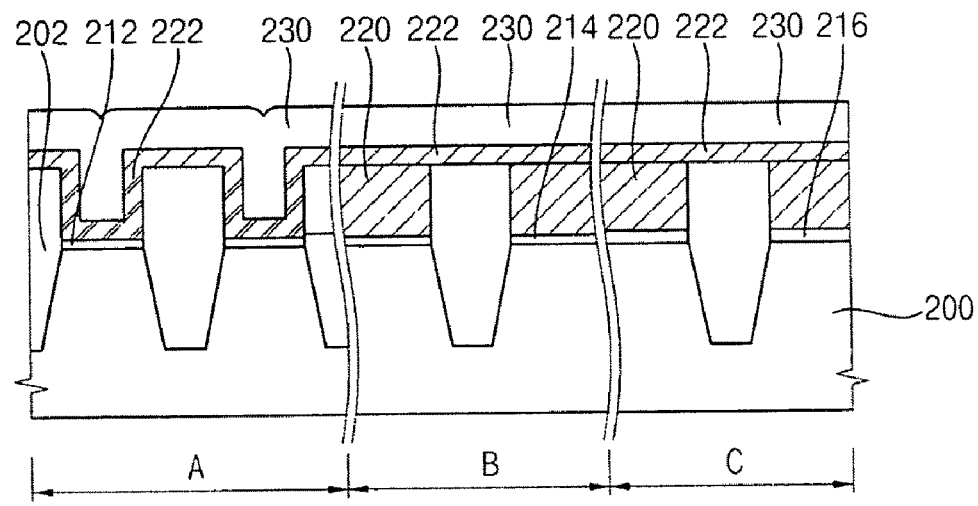

Referring to FIG. 12, a second conductive layer 222 may be formed on the first conductive layer pattern 220, the isolation layers 202, and the first dielectric layer pattern 212. In an implementation, the second conductive layer 222 may be conformally formed thereon, and thus may not completely fill spaces between the isolation layers 202 on the first dielectric layer pattern 212. The second conductive layer 222 may be formed using a material substantially the same as or different from that of the first conductive layer 220.

A sacrificial layer 230 may be formed on the second conductive layer 222 to fill remaining portions of the spaces between the isolation layers 202 on the first dielectric layer pattern 212.

Figure 13:
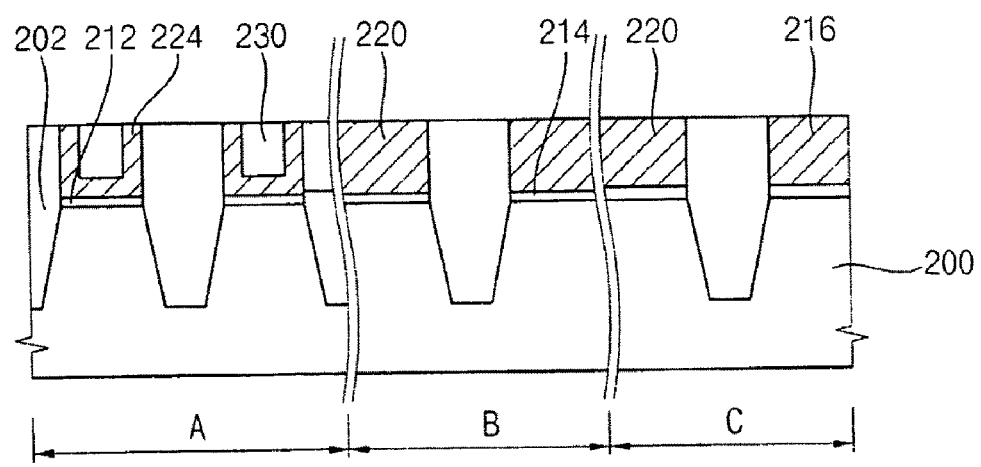

Referring to FIG. 13, upper portions of the sacrificial layer 230 and the second conductive layer 222 may be planarized until a top surface of the first conductive layer pattern 220 is exposed. Thus, a second conductive layer pattern 224 having a U-shape may be formed on the first dielectric film pattern 212 in the cell region A.

Figure 14:
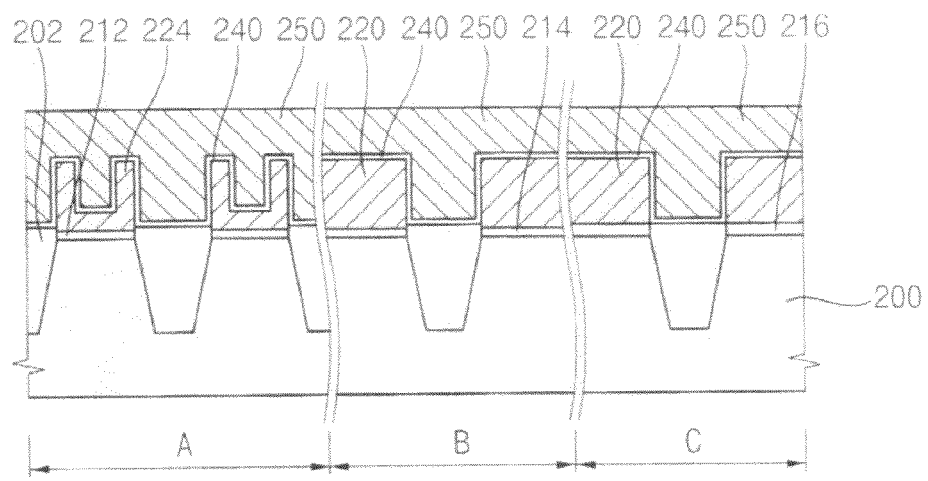

Referring to FIG. 14, upper portions of the isolation layers 202 may be removed to expose sidewalls of the second conductive layer pattern 224 in the cell region A and sidewalls of the first conductive layer pattern 220 in the core/peripheral regions B and C. The sacrificial layer 230 may be removed to expose an upper surface of the second conductive layer pattern 224.

A dielectric layer and a third conductive layer may be sequentially formed on the first and second conductive layer patterns 220 and 224 and the isolation layers 202. The third conductive layer and the dielectric layer may be patterned to form a control gate 250 and a dielectric layer pattern 240, respectively. In an implementation, each of the control gate 250 and the dielectric layer pattern 240 may extend in a second direction perpendicular to the first direction. Additionally, the first and second conductive layer patterns 220 and 224 may be patterned to extend in the second direction. Thus, the flash memory device in accordance with an embodiment may be manufactured. The photoresist compositions and methods of forming a pattern in accordance with an embodiment may be used in the patterning process.

The photoresist compositions and methods of forming a pattern in accordance with an embodiment may not be limited to the DRAM device or flash memory device, and may be applied to other memory devices, e.g., a phase-change random access memory (PRAM) device, a magnetic random access memory (MRAM) device, a ferroelectric random access memory (FRAM) device, etc., or other electronic devices, e.g., integrated circuit (IC) devices, printed circuit boards (PCBs), microelectromechanical systems (MEMS), display devices, image display devices, etc.

Synthesis of a Photoresist Polymer

Synthesis Example 1

About 0.992 g of 3-(trimethoxysilyl)propyl methacrylate, about 1.056 g of gamma-butyrolactonyl methacrylate, and about 0.03 g of 2,2-azobisisobutyronitrile were added to a polymerization flask and dissolved in about 8 g of refined tetrahydrofuran to prepare a solution. The solution was polymerized under a nitrogen atmosphere at a temperature of about 65° C. for about 24 hours. After the polymerization, the resultant was precipitated in hexane solution and filtered. The filtrate was dried in a vacuum atmosphere to obtain poly(3-(trimethoxysilyl)propyl)-co-(gamma-butyrolactonyl methacrylate). A yield was about 45%. A weight-average molecular weight (Mw) of the synthesized polymer was about 9,000; and the glass transition temperature (Tg) thereof was about 160° C.

Preparation of a Photoresist Composition

Example 1

About 0.2 g (about 12.4 wt %) of the polymer obtained from Synthesis Example 1 and about 0.006 g (about 0.4 wt %) of triphenylsulfonium triflate (as a photoacid generator) were dissolved into about 1.4 g (about 87.2 wt %) of cyclopentanone to prepare a solution under conditions in which far-ultraviolet radiation was blocked. After the dissolution, the solution was filtered by a 0.2 µm filter to obtain a photoresist composition. The viscosity of the composition was about 2.5 cp.

Example 2

About 0.1 g (about 9 wt %) of the polymer obtained from Synthesis Example 1 and about 0.003 g (about 0.3 wt %) of triphenylsulfonium triflate were dissolved into about 1 g (about 90.7 wt %) of cyclopentanone to prepare a solution under the conditions in which far-ultraviolet radiation was blocked. After the dissolution, the solution was filtered by a 0.2 µm filter to obtain a photoresist composition. The viscosity of the composition was about 2.5 cp.

Example 3

About 0.1 g (about 4.8 wt %) of the polymer obtained from Synthesis Example 1 and about 0.003 g (about 0.1 wt %) of triphenylsulfonium triflate were dissolved in about 2 g (about 95.1 wt %) of cyclopentanone to prepare a solution under the conditions in which far-ultraviolet radiation was blocked. After the dissolution, the solution was filtered by a 0.2 µm filter to obtain a photoresist composition. The viscosity of the composition was about 2.5 cp.

Comparative Example 1

A commercially available photoresist composition including novolac resin (sold as Novolac from Hexion Specialty Chemicals) was prepared.

Forming a Photoresist Pattern

A photoresist pattern was formed using the photoresist composition prepared in Example 1. The composition of Example 1 was spin-coated on a silicon wafer treated with hexamethyldisilazane (HMDS), as an adhesion promoter, to form a photoresist film having a thickness of about 0.3 µm. An exposure process was performed on the photoresist film by an exposure apparatus using an Hg/Xe lamp at an energy of about 13 mJ. The exposure process was performed at room temperature (about 25° C.). During the exposure process, a cross-linking reaction of the polymer was catalyzed by an acid generated from the photoacid generator. Thus, a post exposure baking (PEB) process was not performed after the exposure process. Without performing the PEB process, a developer was provided for about 60 seconds to the photoresist film that had been exposed to light to form a photoresist pattern having a line width of about 0.6 µm. Cyclopentanone was used as the developer.

Figure 15:
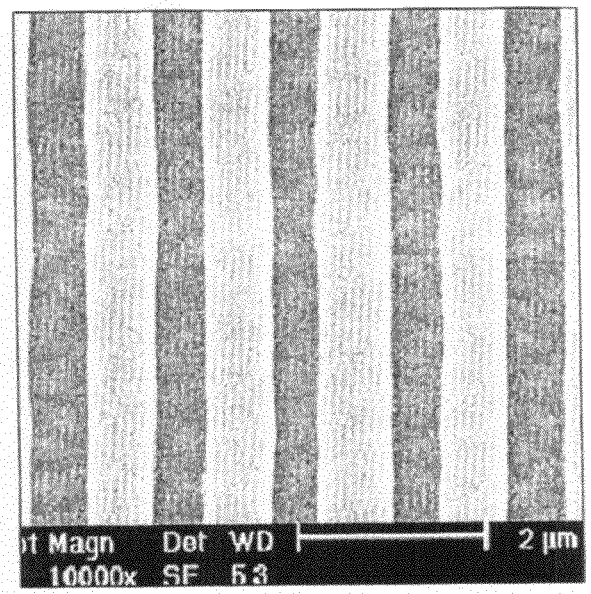
FIG. 15 illustrates a scanning electron microscope (SEM) image of a photoresist pattern formed using the photoresist composition of Example 1.

FIG. 15 illustrates a scanning electron microscope (SEM) image of a photoresist pattern formed using the photoresist composition of Example 1.

Referring to FIG. 15, even without performing a PEB process, an exposed portion of the photoresist film was sufficiently cured such that the photoresist pattern exhibited improved characteristics of profile and line width roughness, indicating that the pattern may be effectively used for imaging. The line edge roughness of the photoresist pattern was about 12 nm.

Evaluation of an Etch Resistance of a Photoresist Film

Photoresist films were formed using the photoresist compositions prepared in Example 2 and Comparative Example 1. Etching resistances of the photoresist films were then evaluated.

The photoresist composition of Example 2 was spin-coated on a silicon wafer and exposed to light for about 30 seconds by an exposure apparatus using an Hg/Xe lamp to form a first photoresist film. No PEB process was performed after the exposure process. The photoresist composition of Comparative Example 1 was also spin-coated on a silicon wafer, exposed to light for about 50 seconds by the exposure apparatus using an Hg/Xe lamp, and was cured by heating at a temperature of about 200° C. for about 10 minutes to form a second photoresist film.

A dry etching process using oxygen plasma was performed on each of the first and second photoresist films. The dry etching process was performed at an oxygen flow rate of about 30 sccm under a pressure of about 200 mTorr with a RF power of about 100 W. Thicknesses of the first and second photoresist films were measured to evaluate the etching resistances thereof.

Figure 16:
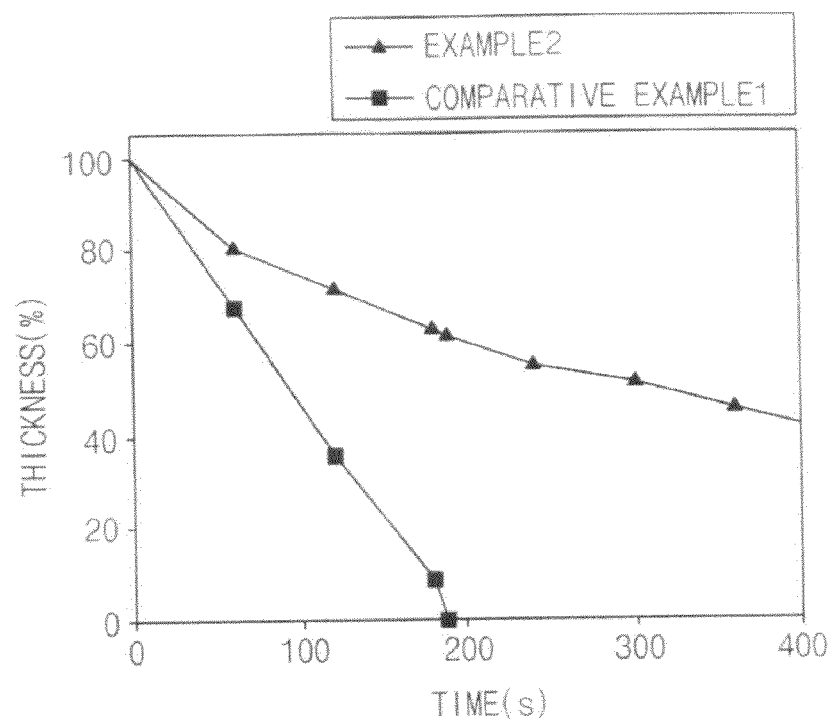
FIG. 16 illustrates a graph showing thickness changes of first and second photoresist films.

FIG. 16 illustrates a graph showing thickness changes of the first and second photoresist films.

Referring to FIG. 16, the thickness of the second photoresist film of Comparative Example 1 was sharply reduced, indicating that most of the second photoresist film was lost after about 180 seconds from the beginning of the dry etching process. In comparison to Comparative Example 1, the thickness of the first photoresist film of Example 2 was more slowly reduced. About 62% of the first photoresist film remained after about 180 seconds from the beginning of the dry etching process. Further, about 46% of the first photoresist film remained after about 360 seconds from the beginning thereof. Thus, the first photoresist film of Example 2 exhibited an etching resistance much higher than that of the second photoresist film of Comparative Example 1.

Forming a Bilayer Photoresist Pattern Structure

A bilayer photoresist pattern structure was formed using the photoresist composition prepared in Example 3.

The commercially available novolac resin composition (sold as Novolac from Hexion Specialty Chemicals) was spin-coated on a silicon wafer under conditions in which far-ultraviolet radiation was blocked, exposed to light for about 50 seconds, and heated at a temperature of about 200° C. for about 10 minutes to form a lower flat film having a thickness of about 0.6 µm. The photoresist composition prepared in Example 3 was spin-coated on the lower flat film to form an upper photoresist film having a thickness of about 0.15 µm. An exposure process on the upper photoresist film was performed at an energy of about 13 mJ by the exposure apparatus using an Hg/Xe lamp. The upper photoresist film was developed using cyclopentanone for about 60 seconds to form an upper photoresist pattern having an image on the lower flat film. Portions of the lower flat film was removed using the upper photoresist pattern as an etching mask by a plasma etching reactor for about 15 minutes, thereby forming a lower photoresist pattern. The dry etching process was performed on the lower flat film at an oxygen flow rate of about 30 sccm under a pressure of about 200 mTorr with a RF power of about 100 W. The upper and lower photoresist patterns defined a bilayer photoresist pattern structure.

Figure 17:
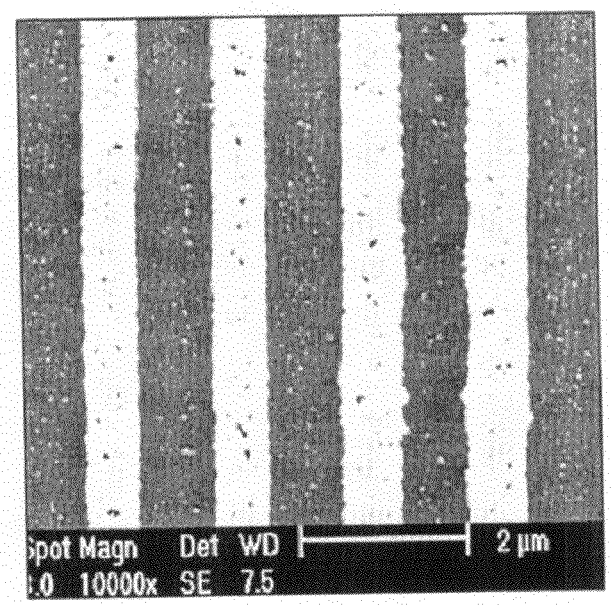
FIG. 17 illustrates a SEM image of a bilayer photoresist pattern structure including the photoresist composition of Example 3.

FIG. 17 illustrates a SEM image of the bilayer photoresist pattern structure including the photoresist composition of Example 3.

Referring to FIG. 17, the bilayer photoresist pattern structure having a clear profile may be formed even after performing the dry etching process. That is, even without performing a PEB process, the exposed portion of the photoresist film may be sufficiently cured such that the photoresist pattern may have a high etching resistance, and pattern imaging may be performed.

The bilayer photoresist pattern structure may serve as a spin-on hard mask, and may include a lower resist pattern and an upper resist pattern. The lower resist pattern may have a relatively thick thickness, and may have anti-reflectivity and/or etching resistance. The upper resist pattern may have a relatively thin thickness. The lower resist pattern may be used for planarization; and the upper resist pattern may be used for imaging. The photoresist composition of an embodiment may be coated by a spin-coating process and may have a high etching resistance due to silicon therein. Thus, the photoresist composition may serve as the upper resist pattern. Additionally, an exposed portion of the photoresist film of an embodiment may be sufficiently cured without performing the PEB process so that acid may be prevented from diffusing into a non-exposed portion due to heat; and the bilayer photoresist pattern structure may have an improved line width roughness.

According to an embodiment, the photoresist composition may include a polymer having an alkoxysilyl group as a side chain. The polymer may be exposed to light and cross-linked to form a cured pattern without a post-exposure bake (PEB) process. Additionally, acid generated from a photoacid generator may serve as a catalyst for the cross-linking reaction among the alkoxysilyl groups to have a high sensitivity of a chemically amplified photoresist.

In contrast, in a chemically amplified photoresist requiring the PEB process, there may be a post-exposure delay between the exposure process in which an acid may be generated and the PEB process in which chemical reactions may be catalyzed by the acid. During heating of the photoresist, a resolution and a line width roughness may be undesirably reduced because the acid generated from the photoacid generator may be diffused to a non-exposed portion. The acid generated in an exposed portion may be neutralized by alkali species, e.g., ammonia, in an atmosphere so that reactivity may decrease and a pattern having a T-top shape may be formed.

However, the method of forming a pattern of an embodiment may not include the PEB process, so that acid generated by the exposure process may be involved in the cross-linking reaction among the alkoxysilyl groups without a time delay. Accordingly, acid diffusion to the non-exposed portion and transformation of the pattern to, e.g., the T-top shape, may be prevented; and the resolution and line width roughness (LWR) of the photoresist pattern may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a pattern, the method comprising:
    forming a photoresist film on a substrate by coating a photoresist composition thereon, the photoresist composition including a polymer, a photoacid generator, and a solvent, wherein:
        the polymer includes an alkoxysilyl group as a side chain and is cross-linkable by an acid to be insoluble in a developer, and
        the polymer is prepared by polymerization of a monomer mixture including at least about 40 mole % of a monomer including an alkoxysilyl group;
    curing a first portion of the photoresist film by exposing the first portion to light, the exposed first portion being cured by a cross-linking reaction of the alkoxysilyl groups therein and being cured at a temperature of less than about 60° C.; and
    providing a developer to the photoresist film to remove a second portion of the photoresist film that is not exposed to light, thereby forming a photoresist pattern on the substrate.

2. The method as claimed in claim 1, wherein the polymer includes a repeating unit represented by Chemical Formula 1:

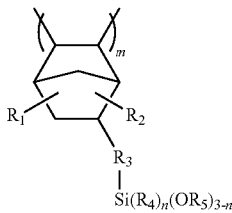

(1)

wherein, in Chemical Formula 1, $R_1$ and $R_2$ are each independently hydrogen, a $C_1$-$C_4$ alkyl group, a $C_1$-$C_4$ alkoxy, or phenyl group, $R_3$ is a divalent functional group including at least one of a $C_1$ to $C_6$ alkylene chain, arylene, alkyleneoxy, aryleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, and a $C_6$-$C_{30}$ unsaturated aliphatic divalent group, each $R_4$ is independently a $C_1$-$C_{10}$ alkyl group, an aryl group, or a $C_2$-$C_6$ alkenyl group, and each $R_5$ is independently a $C_1$-$C_4$ alkyl group, and $2 \leq m \leq 10,000$, $0 \leq n \leq 2$, m and n are integers, when n is 0 or 1, groups represented by $OR_5$ are substantially the same as or different from each other, and when n is 2, groups represented by $R_4$ are substantially the same as or different from each other.

3. The method as claimed in claim 1, wherein the polymer includes a repeating unit represented by Chemical Formula 2:

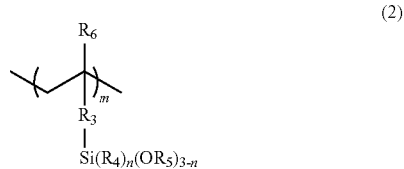

(2)

wherein, in Chemical Formula 2, $R_6$ is hydrogen, a $C_1$-$C_4$ alkyl group, a $C_1$-$C_4$ alkoxy group, or a phenyl group, $R_3$ is a divalent functional group including at least one of a $C_1$-$C_6$ alkylene chain, arylene, alkyleneoxy, aryleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, and a $C_6$-$C_{30}$ unsaturated aliphatic divalent group, each $R_4$ is independently a $C_1$-$C_{10}$ alkyl group, an aryl group, or a $C_2$-$C_6$ alkenyl group, and each $R_5$ is independently a $C_1$-$C_4$ alkyl group, and $2 \leq m \leq 10,000$, $0 \leq n \leq 2$, m and n are integers, when n is 0 or 1, groups represented by $OR_5$ are substantially the same as or different from each other, and when n is 2, groups represented by $R_4$ are substantially the same as or different from each other.

4. The method as claimed in claim 1, wherein the polymer includes a repeating unit represented by Chemical Formula 3:

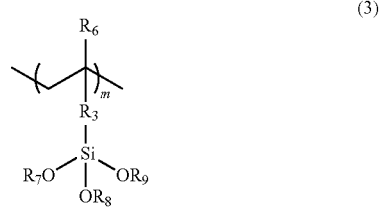

(3)

wherein, in Chemical Formula 3, $R_6$ is hydrogen or a $C_1$-$C_4$ alkyl group, $R_3$ is a divalent functional group including at least one of a $C_1$-$C_6$ alkylene chain, arylene, alkyleneoxy, aryleneoxy, oxyalkylene, oxyarylene, carbonyl, oxy, oxycarbonyl, carbonyloxy, carbonylalkylene, alkylenecarbonyl, carbonyloxyalkylene, carbonylarylene, alkylenecarbonyl, arylenecarbonyl, a $C_6$-$C_{30}$ aliphatic ester group, and a $C_6$-$C_{30}$ unsaturated aliphatic divalent group, and $R_7$, $R_8$ and $R_9$ are each independently $C_1$-$C_4$ alkyl groups, and $2 \leq m \leq 10,000$ and m is an integer.

5. A method of forming a pattern, the method comprising:
    forming a lower resist film;
    forming an upper resist film on the lower resist film by coating a photoresist composition thereon, the photoresist composition including a polymer, a photoacid generator, and a solvent, the polymer including an alkoxysilyl group as a side chain and being cross-linkable by an acid to be insoluble in a developer, and the polymer being prepared by polymerization of a monomer mixture including at least about 40 mole % of a monomer including an alkoxysilyl group;

curing a first portion of the upper resist film by exposing the first portion to light, the exposed first portion being cured by a cross-linking reaction of the alkoxysily groups therein and being cured at a temperature of less than about 60° C.;

providing a developer to the upper resist film to remove a second portion of the upper resist film that is not exposed to light, thereby forming a upper resist pattern on the lower resist film; and partially removing the lower resist film using the upper resist pattern as an etching mask to form a lower resist pattern, the lower and upper resist patterns forming a bilayer resist pattern structure on the substrate.

6. The method as claimed in claim 5, further comprising:

forming an object layer on the substrate prior to forming the lower resist film; and partially removing the object layer using the bilayer resist pattern structure to form an object layer pattern on the substrate.

7. The method as claimed in claim 5, further comprising forming a trench at an upper portion the substrate by an etching process using the bilayer resist pattern structure as an etching mask.

8. The method as claimed in claim 1, wherein the exposed portion is cured at a temperature of about 5° C. to about 60° C.

9. The method as claimed in claim 1, wherein the exposed portion is cured at a temperature of about 10° C. to about 50° C.

10. The method as claimed in claim 1, wherein the exposed portion is cured at a temperature of about 10° C. to about 40° C.

11. The method as claimed in claim 1, wherein the exposed portion is cured at a temperature of about 10° C. to about 30° C.

12. The method as claimed in claim 5, wherein the exposed portion is cured at a temperature of about 5° C. to about 60° C.

13. The method as claimed in claim 5, wherein the exposed portion is cured at a temperature of about 10° C. to about 50° C.

14. The method as claimed in claim 5, wherein the exposed portion is cured at a temperature of about 10° C. to about 40° C.

15. The method as claimed in claim 5, wherein the exposed portion is cured at a temperature of about 10° C. to about 30° C.

16. A method of forming a pattern, the method consisting essentially of:

forming a photoresist film on a substrate by coating a photoresist composition thereon, the photoresist composition including a polymer, a photoacid generator, and a solvent, wherein the polymer includes an alkoxysilyl group as a side chain and is cross-linkable by an acid to be insoluble in a developer;

curing a first portion of the photoresist film by exposing the first portion to light, the exposed first portion being cured by a cross-linking reaction of the alkoxysilyl groups therein and being cured at a temperature of less than about 60° C.; and providing a developer to the photoresist film to remove a second portion of the photoresist film that is not exposed to light, thereby forming a photoresist pattern on the substrate.

* * * * *